(12) United States Patent
Nakatsuji et al.

(10) Patent No.: US 11,102,919 B2
(45) Date of Patent: Aug. 24, 2021

(54) MANAGEMENT APPARATUS, MOUNT SUBSTRATE MANUFACTURING SYSTEM, AND MOUNT SUBSTRATE MANUFACTURING METHOD

(71) Applicant: Panasonic Intellectual Property Management Co., Ltd., Osaka (JP)

(72) Inventors: Hachiro Nakatsuji, Yamanashi (JP); Kenji Okamoto, Hyogo (JP); Yuji Nakamura, Yamanashi (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 836 days.

(21) Appl. No.: 15/075,223

(22) Filed: Mar. 21, 2016

(65) Prior Publication Data
US 2016/0309629 A1    Oct. 20, 2016

(30) Foreign Application Priority Data

Apr. 15, 2015    (JP) .............................. JP2015-082967

(51) Int. Cl.
*H05K 13/08*    (2006.01)
*H05K 13/04*    (2006.01)
*H05K 3/34*    (2006.01)

(52) U.S. Cl.
CPC .......... *H05K 13/08* (2013.01); *H05K 13/085* (2018.08); *G05B 2219/45031* (2013.01); *H05K 3/3494* (2013.01); *Y02P 90/02* (2015.11)

(58) Field of Classification Search
CPC .......... H05K 13/08; H05K 13/04; H05K 3/30; H05K 3/301–34; Y10T 29/4913;
(Continued)

(56) References Cited

U.S. PATENT DOCUMENTS 5,495,417 A * 2/1996 Fuduka ................ G05B 13/042
                                                    700/121
5,822,210 A * 10/1998 Kobayashi ............. H01L 22/20
                                                    700/121

(Continued)

FOREIGN PATENT DOCUMENTS

CN          1937909 A    3/2007
CN       101208640 A    6/2008
(Continued)

OTHER PUBLICATIONS

English Translation of Chinese Search Report dated Jun. 19, 2019 for the related Chinese Patent Application No. 201610213320.4.
(Continued)

*Primary Examiner* — Peter Dungba Vo
*Assistant Examiner* — Kaying Kue
(74) *Attorney, Agent, or Firm* — Pearne & Gordon LLP

(57) ABSTRACT

A management apparatus is connected to a mount substrate manufacturing line including a print apparatus, a component mounting apparatus, and a reflow apparatus, through a network. The management apparatus instructs at least one of apparatuses that are at a more upstream side than a reflow apparatus in a mount substrate manufacturing line to start production of the mount substrate, based on first data relating to the period of time necessary to complete preparation for the performing of a process by the reflow apparatus.

18 Claims, 12 Drawing Sheets

(58) Field of Classification Search
CPC ......... Y10T 29/53174; Y10T 29/35178; Y10T 29/53183; Y10T 29/53096
USPC .......................................................... 29/729
See application file for complete search history.

(56) References Cited

U.S. PATENT DOCUMENTS

| | | | | |
|---|---|---|---|---|
| 6,711,456 | B2* | 3/2004 | Yokomori | G05B 19/41865 700/169 |
| 7,142,939 | B2* | 11/2006 | Nonaka | G05B 19/41805 700/121 |
| 8,090,557 | B2* | 1/2012 | Koch | G05B 19/4097 703/1 |
| 8,621,786 | B2* | 1/2014 | Lam | E04H 5/02 52/174 |
| 9,353,543 | B2* | 5/2016 | Lam | E04H 5/02 |
| 9,781,837 | B2* | 10/2017 | Maenishi | G05B 19/41865 |
| 10,139,810 | B2* | 11/2018 | Nakamura | H05K 13/089 |
| 2002/0193972 | A1* | 12/2002 | Kudo | G05B 19/41885 703/1 |
| 2004/0153868 | A1* | 8/2004 | Nonaka | G06Q 10/10 714/47.2 |
| 2009/0099678 | A1* | 4/2009 | Kurata | H05K 13/086 700/106 |

FOREIGN PATENT DOCUMENTS

| | | |
|---|---|---|
| JP | 5-102698 | 4/1993 |
| JP | 2005-125340 | 5/2005 |
| JP | 2007-088023 A | 4/2007 |

OTHER PUBLICATIONS

English Translation of Chinese Search Report dated Nov. 4, 2020 for the related Chinese Patent Application No. 201610213320.4.

* cited by examiner

*FIG. 5A*

| FIRST DATA 52 | | | |
|---|---|---|---|
| START-UP DATA 52(1) | | MACHINE-SWITCHING DATA 52(2) | |
| SUBSTRATE TYPE 52(1)a | TIME REQUIRED FOR PREPARATION 52(1)b | SWITCHING PATTERN 52(2)a | TIME REQUIRED FOR PREPARATION 52(2)b |
| A | aa | A→B | ab |
| B | bb | A→C | ac |
| C | cc | B→A | ba |
| . |  | B→C | bc |
| . |  | C→A | ca |
| . |  | C→B | cb |

*FIG. 5B*

| SECOND DATA 53 | |
|---|---|
| SUBSTRATE TYPE 53a | TIME REQUIRED FOR MANUFACTURING 53b |
| A | a∗a |
| B | b∗b |
| C | c∗c |
| . |  |
| . |  |

FIG. 6

| AUXILIARY OPERATIONAL DATA (54) | | | |
|---|---|---|---|
| OPERATIONAL TYPE | | TIME REQUIRED FOR OPERATION | PRIORITY LEVEL |
| MAJOR ITEM | MINOR ITEM | | |
| MAINTENANCE | SUCTION NOZZLE | X MINUTE/ ONE NOZZLE | B |
| | ⋮ | | |
| CALIBRATION | MOUNTING HEAD | Y MINUTES/ ONE HEAD | A |
| | TAPE FEEDER | Z MINTUES/ ON FEEDER | B |
| | BEAM HEATING COMPENSATION | M MINUTE/ ONE TIME | A |
| | ⋮ | | |
| WARM-UP | IDLING | N MINUTES (MINIMUM NECESSARY TIME) | C |
| | ⋅ | | |

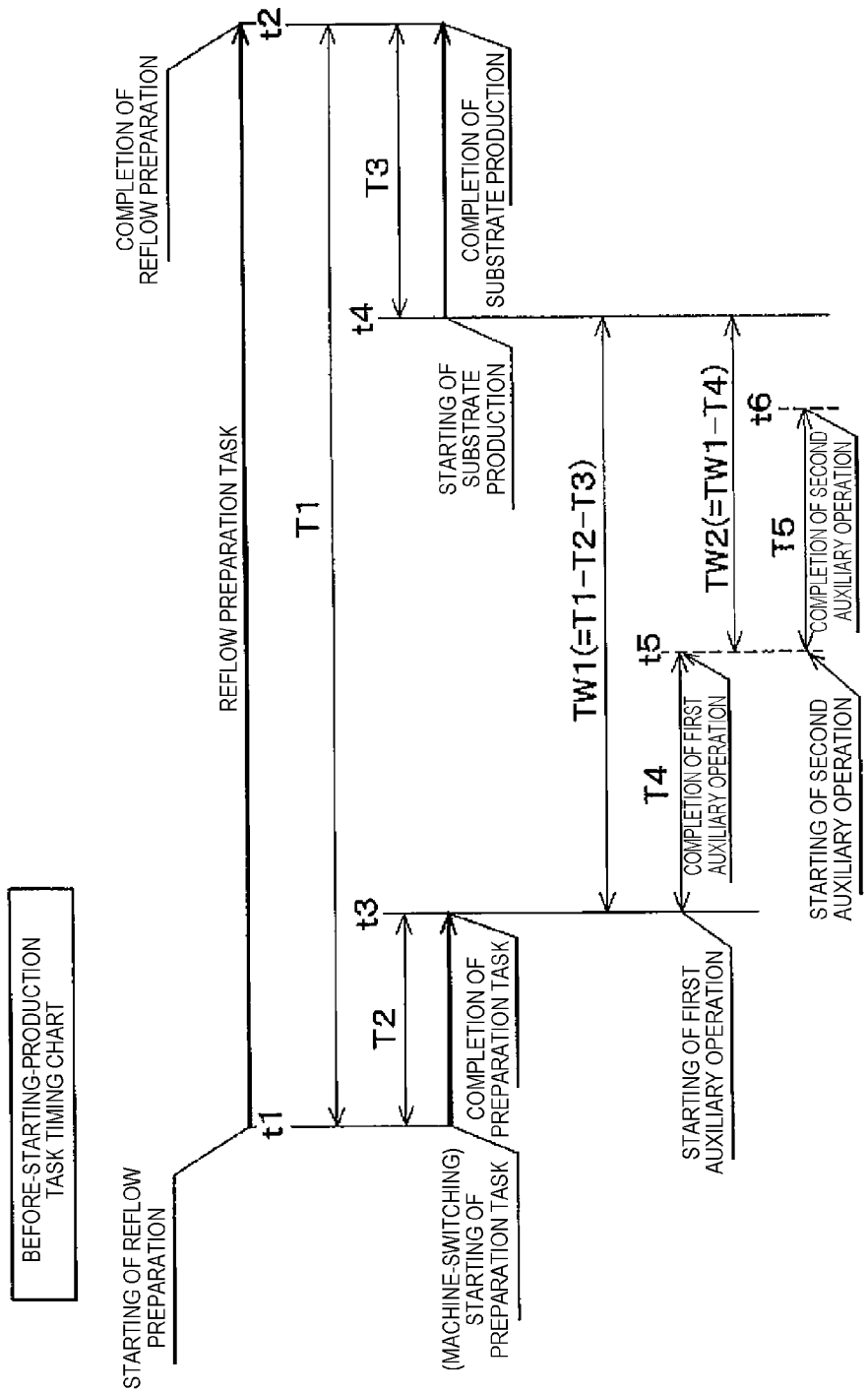

MANAGEMENT APPARATUS, MOUNT SUBSTRATE MANUFACTURING SYSTEM, AND MOUNT SUBSTRATE MANUFACTURING METHOD

BACKGROUND

1. Technical Field

The present disclosure relates to a management apparatus that is connected to a mount substrate manufacturing line through a network, a mount substrate manufacturing system, and a mount substrate manufacturing method.

2. Description of the Related Art

A mount substrate manufacturing line in which a mount substrate that results from mounting an electronic component on a circuit substrate is manufactured is configured to include multiple apparatus that are connected to one another, such as a print apparatus that prints component bonding solder on the circuit substrate, a component mounting apparatus that mounts the electronic component on the circuit substrate on which the solder is printed, and a reflow apparatus that heats the circuit substrate after the component is mounted and thus solder-bonds the electronic component to the circuit substrate (refer to Japanese Patent Unexamined Publication No. 5-102698). When production is performed in the mount substrate manufacturing line, a preparation process is needed for causing a state of each apparatus to be a state suitable for the mount substrate that is to perform the production, such as a start-up process that causes each apparatus to be in a state of being operable at the time of starting the production, or a machine-switching process at the time of the mount substrate that is to performs the production switching. Among these apparatuses, in the reflow apparatus, a process of adjusting a reflow condition that results from setting up a temperature or an atmosphere within a reflow oven according to a substrate which is to be produced is needed (refer to Japanese Patent Unexamined Publication No. 2005-125340).

SUMMARY

The present disclosure is to provide a management apparatus, a mount substrate manufacturing system, and a mounting substrate manufacturing method, in which a decrease in production efficiency that is due to the fact that other apparatuses wait without starting production during a period of time up to and including the time when a preparation process is completed in a reflow apparatus can be suppressed.

A management apparatus according to an aspect of the present disclosure is a management apparatus that is connected to a mount substrate manufacturing line which includes at least a print apparatus, a component mounting apparatus, and a reflow apparatus through a network. The management apparatus instructs at least one of apparatuses that are at a more upstream side than the reflow apparatus in the mount substrate manufacturing line to start a production of the substrate, based on first data relating to a period of time necessary to complete preparation for performing a process by the reflow apparatus.

A mount substrate manufacturing system according to another aspect of the present disclosure includes a mount substrate manufacturing line that includes at least a print apparatus, a component mounting apparatus, and a reflow apparatus, and a management apparatus that is connected to the mount substrate manufacturing line through a network. The management apparatus instructs at least one of apparatuses that are at a more upstream side than the reflow apparatus in the mount substrate manufacturing line to start the production of the substrate, based on first data relating to a period of time necessary to complete preparation for performing a process by the reflow apparatus.

A mount substrate manufacturing method according to still another aspect of the present disclosure is a mount substrate manufacturing method for use in a mount substrate manufacturing system that includes a mount substrate manufacturing line which includes at least a print apparatus, a component mounting apparatus, and a reflow apparatus, and a management apparatus connected to the mount substrate manufacturing line through a network. In the manufacturing method, the management apparatus instructs at least one of apparatuses that are at a more upstream side than the reflow apparatus in the mount substrate manufacturing line to start the production of the substrate, based on data relating to the period of time necessary to complete preparation for performing a process by the reflow apparatus.

According to the present disclosure, a decrease in production efficiency that is due to the fact that other apparatuses wait without starting production during a period of time up to and including the time when a preparation process is completed in a reflow apparatus can be suppressed.

BRIEF DESCRIPTION OF DRAWINGS

FIG. 5A is an explanatory diagram illustrating first data that is used for preparation before starting production in a mount substrate manufacturing method according to an exemplary embodiment of the present disclosure;

FIG. 5B is an explanatory diagram illustrating second data that is used for the preparation before starting the production in the mount substrate manufacturing method according to the exemplary embodiment of the present disclosure;

FIG. 6 is an explanatory diagram illustrating auxiliary operational data that is used for the preparation before starting the production in the mount substrate manufacturing method according to the exemplary embodiment of the present disclosure;

FIG. 10 is a timing chart of the before-starting-production process in the mount substrate manufacturing method according to the exemplary embodiment of the present disclosure.

DETAILED DESCRIPTION OF THE PREFERRED EMBODIMENT

Problems with technologies in the related art will be briefly described below before providing descriptions of exemplary embodiments of the present disclosure. Among preparatory operations necessary for equipment that constitutes the above-described mount substrate manufacturing line, a preparatory operation necessary for a reflow apparatus takes a lot of time compared with other apparatuses. For example, with regard to a temperature, temperature adjustment has to be made in such a manner that temperature distribution suitable for a temperature profile that is set in advance for each mount substrate is available within a reflow oven, and with regard to an atmosphere within the oven, atmosphere adjustment has to be made in such a manner that oxygen concentration within the oven is suitable for a condition for solder bonding in use. A decrease in production efficiency is unavoidable because a waiting state is forced to be maintained without starting production of other apparatuses until a preparatory operation for this reflow apparatus is completed.

Figure 1:
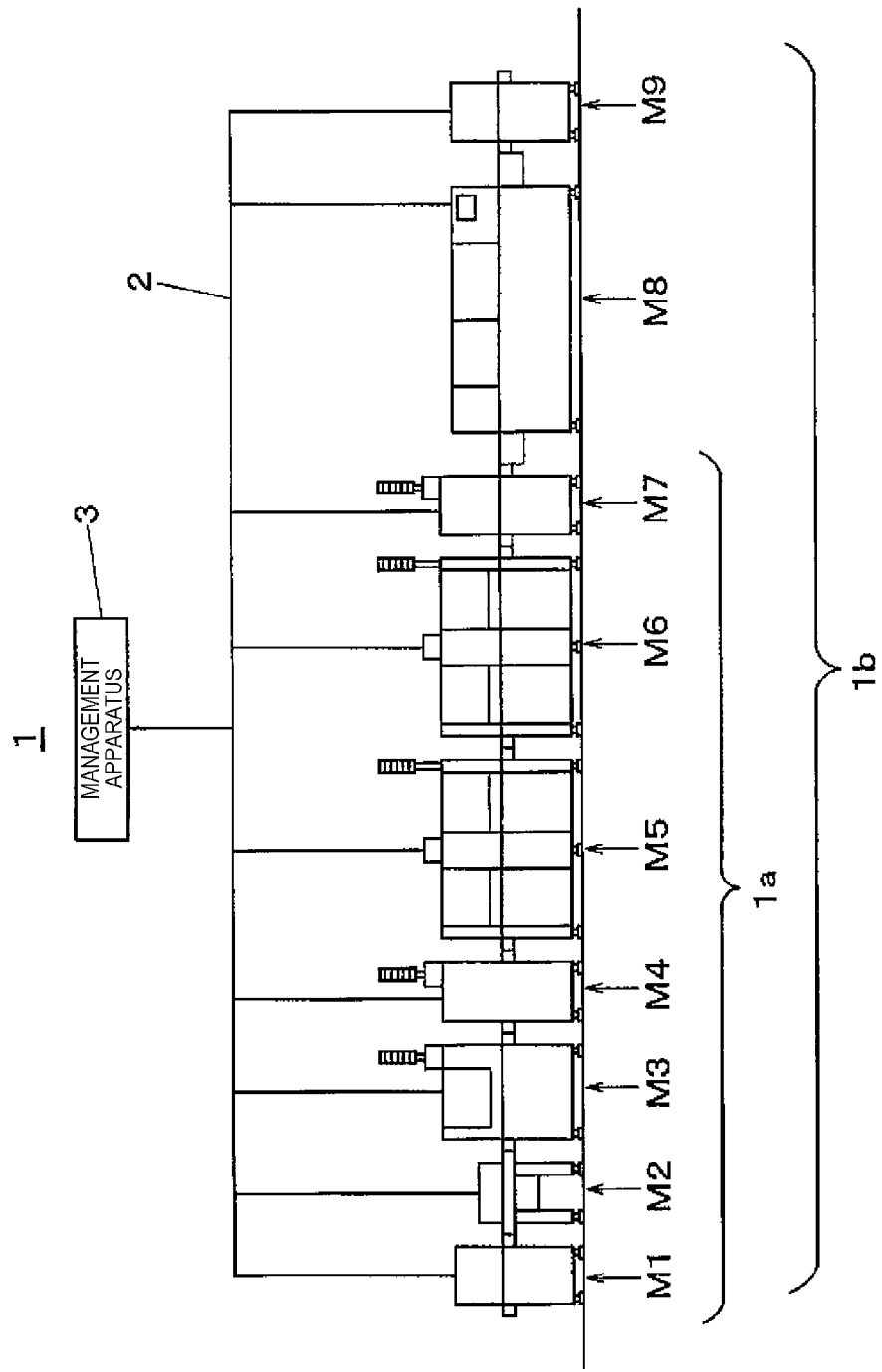
FIG. 1 is an explanatory diagram illustrating a configuration of a mount substrate manufacturing system according to an exemplary embodiment of the present disclosure.

Next, an exemplary embodiment of the present disclosure is described referring to the drawings. First, a configuration of mounting substrate manufacturing system 1 is described referring to FIG. 1. Mount substrate manufacturing system 1 has a function of manufacturing a mount substrate that results from solder-bonding an electronic component on a substrate. Mount substrate manufacturing system 1 for performing the component mounting operation includes mount substrate manufacturing line 1b and management apparatus 3. Management apparatus 3 is connected to mount substrate manufacturing line 1b through network 2. Mount substrate manufacturing line 1b is configured to connect substrate supply apparatus M1, substrate delivery apparatus M2, print apparatus M3, inspection apparatus M4, component mounting apparatuses M5 and M6, inspection apparatus M7, reflow apparatus M8 and substrate recovery apparatus M9 to each other. That is, each apparatus that constitutes mount substrate manufacturing line 1b is connected to management apparatus 3 through network 2. Management apparatus 3 performs control for production management of mount substrate manufacturing line 1b, such as when a production starting instruction is issued to each of the apparatuses.

Substrate supply apparatus M1 supplies substrate 4 (refer to FIGS. 2A to 3B) on which a component is to be mounted. Supplied substrate 4 is carried into print apparatus M3 through substrate delivery apparatus M2. Print apparatus M3 prints solder paste, on a component-bonding electrode that is formed on the substrate. Inspection apparatus M4 determines whether or not a printing state of the solder which is printed on the substrate is good and performs print inspection including detection of deviation of a position for the printing of the solder on the electrode. Component mounting apparatuses M5 and M6 mount electronic components sequentially on substrate 4 on which the solder is printed by print apparatus M3. Inspection apparatus M7 inspects a state of the component that is mounted on substrate 4, after the electronic component is mounted on substrate 4.

Reflow apparatus M8 solder-bonds the electronic component to the substrate by heating substrate 4 on which the component is mounted in accordance with the temperature profile and then melting the solder. Substrate recovery apparatus M9 recovers a finished product, that is, electronic-component-mounted substrate 4 that goes through the reflow. In the above-described configuration, apparatuses M1 to M7 constitute pre-reflow substrate manufacturing line 1a for manufacturing a pre-reflow substrate that is in a state of before entering a stage of carrying the substrate into reflow apparatus M8 in order to manufacture the mount substrate in mount substrate manufacturing line 1b. According to the present exemplary embodiment, pre-reflow substrate manufacturing line 1a is configured to include at least print apparatus M3 and component mounting apparatuses M5 and M6.

The pre-reflow substrate that is manufactured in pre-reflow substrate manufacturing line 1a is carried into reflow apparatus M8 and then a reflow operation is performed. Thus, the mount substrate on which an electronic component to be mounted is mounted on substrate 4 with solder bonding is manufactured. The expression of pre-reflow substrate manufacturing line 1a is used to collectively refer to apparatuses M1 to M7 that are arranged for a preceding process by reflow apparatus M8 in mount substrate manufacturing line 1b. Consequently, a group of apparatuses M1 to M7 that constitute pre-reflow substrate manufacturing line 1a is not definitely distinguished from reflow apparatus M8 in terms of apparatus configuration or system management.

Figure 2A:
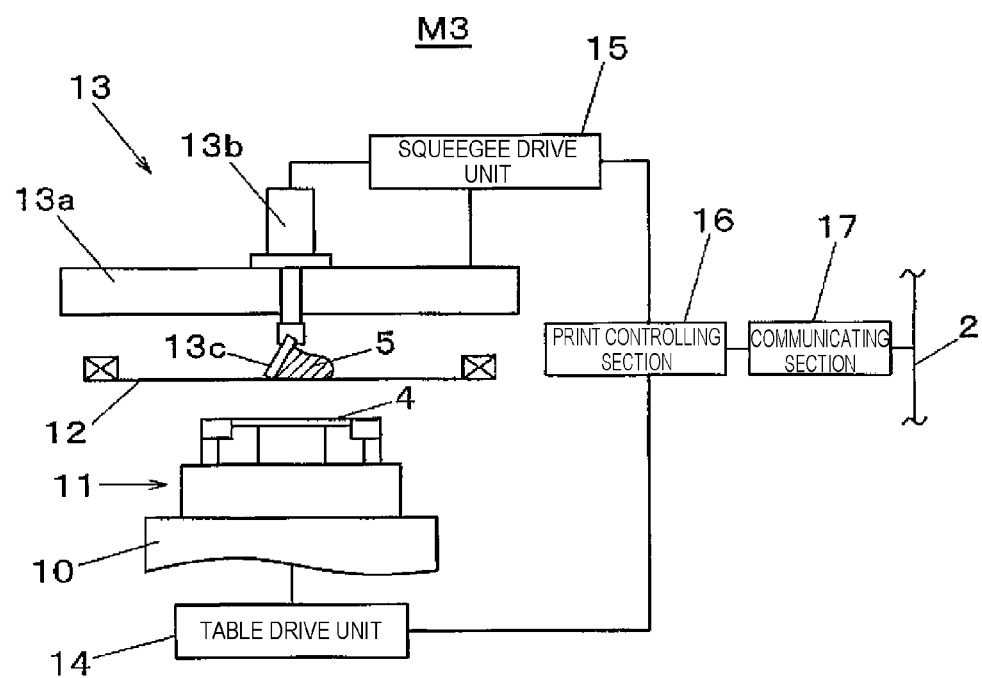
FIG. 2A is an explanatory diagram illustrating a configuration of a print apparatus in the mount substrate manufacturing system according to the exemplary embodiment of the present disclosure.
Figure 2B:
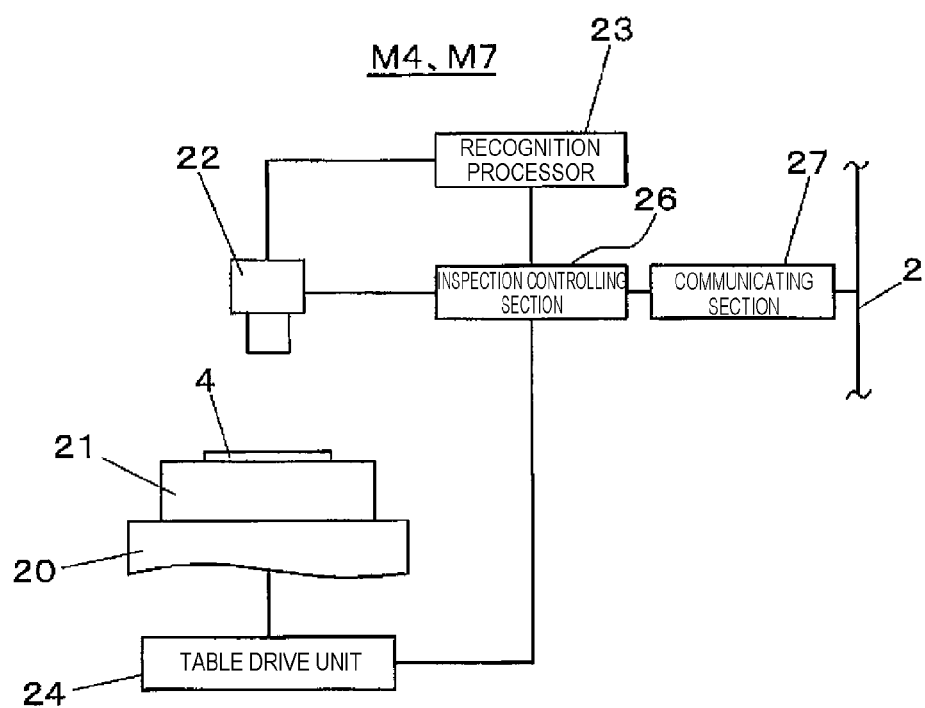
FIG. 2B is an explanatory diagram illustrating a configuration of an inspection apparatus in the mount substrate manufacturing system according to the exemplary embodiment of the present disclosure.

Next, configurations of print apparatus M3 and inspection apparatuses M4 and M7 are described referring to FIGS. 2A and 2B. In print apparatus M3 that is illustrated in FIG. 2A, substrate holding section 11 that is configured to hold substrate 4 by interposing substrate 4 between both sides of substrate holding section 11 is installed on positioning table 10. Mask plate 12 in which a pattern hole that corresponds to a print portion of substrate 4 is provided is installed over substrate holding section 11. Positioning table 10 is driven by table drive unit 14, and thus substrate 4 moves horizontally and vertically relative to mask plate 12.

Squeegee unit 13 is arranged over mask plate 12. Squeegee unit 13 is configured from ascending and descending pressing mechanism 13b that causes squeegee 13c to ascend and descend with respect to mask plate 12 and that presses squeegee 13c against mask plate 12 with a given pressing force (pressure), and squeegee moving mechanism 13a that moves squeegee 13c horizontally. Ascending and descending pressing mechanism 13b and squeegee moving mechanism 13a are driven by squeegee drive unit 15.

Squeegee 13c is moved at a given speed horizontally along a surface of mask plate 12 to which solder paste 5 is supplied, in a state where substrate 4 is brought into contact with a lower surface of mask plate 12, and thus solder paste 5 is printed on substrate 4 through the pattern hole. This print operation is performed by print controlling section 16 controlling table drive unit 14 and squeegee drive unit 15. Print controlling section 16 is connected to network 2 through communicating section 17. In the above-described configuration, substrate holding section 11, mask plate 12, and squeegee unit 13 constitute print mechanism 18 (refer to FIG. 4) for printing solder to substrate 4.

In inspection apparatus M4 that is illustrated in FIG. 2B, substrate holding section 21 is arranged over positioning table 20, and substrate 4 is held in substrate holding section 21. Camera 22 is installed over substrate holding section 21 with an imaging direction being a downward direction, and camera 22 images substrate 4 in a state where an illumination apparatus (not illustrated) emits illumination light to substrate 4. At this time, positioning table 20 is moved by controlling table drive unit 24, and thus an image can be captured with an arbitrary position of substrate 4 being located directly under camera 22.

Image data that is acquired by the imaging is image-processed by recognition processor 23, and a result of recognition is output to inspection controlling section 26. Inspection controlling section 26 performs inspection in terms of each inspection target item based on the result of the recognition, and controls camera 22 and table drive unit 24 and thus performs a inspection operation. Inspection controlling section 26 is connected to network 2 through communicating section 27, and a result of the inspection is output to a different apparatus through communicating section 27. In the above-described configuration, positioning table 20, substrate holding section 21, and camera 22 constitute inspection mechanism 28 (refer to FIG. 4) that performs inspection on substrate 4.

Figure 3A:
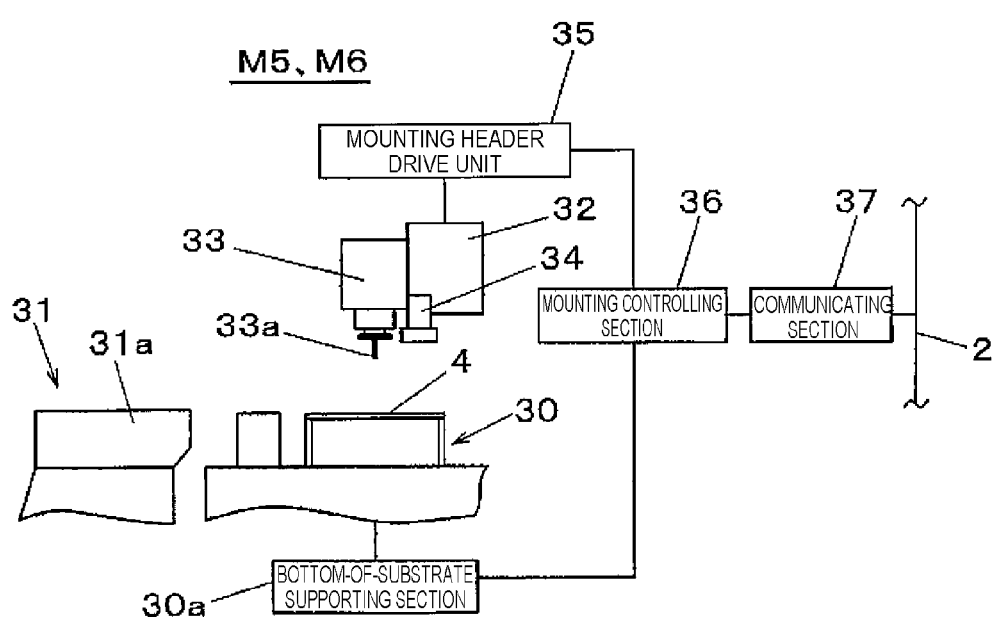
FIG. 3A is an explanatory diagram illustrating a configuration of a component mounting apparatus in the mount substrate manufacturing system according to the exemplary embodiment of the present disclosure.
Figure 3B:
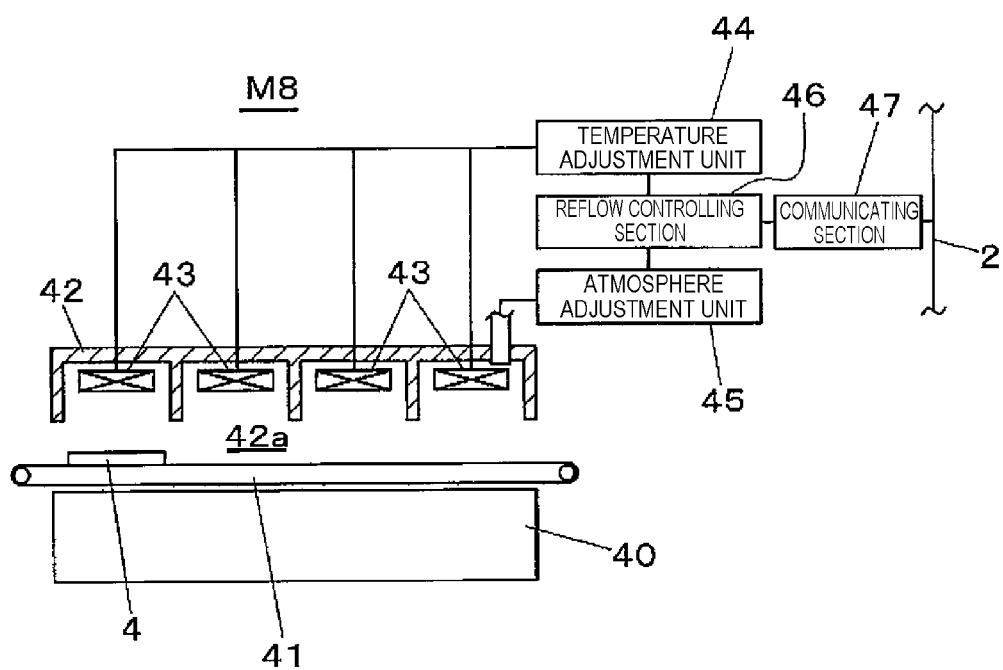
FIG. 3B is an explanatory diagram illustrating configurations of a component mounting apparatus and a reflow apparatus in the mount substrate manufacturing system according to the exemplary embodiment of the present disclosure.

Next, configurations of component mounting apparatuses M5 and M6 and reflow apparatus M8 are described referring to FIGS. 3A and 3B. In component mounting apparatuses M5 and M6 that are illustrated in FIG. 3A, substrate 4 is held and positioned in substrate positioning section 30, and substrate 4 is bottom-supported by bottom-of-substrate supporting section 30a. Component supply unit 31 on which a plurality of tape feeders 31a is mounted is arranged beside substrate positioning section 30. Mounting head 33 that has suction nozzle 33a mounted on the lower end portion, and camera 34 are installed over substrate positioning section 30 in such a manner that mounting head 33 and camera 34 are freely moved by head drive mechanism 32. Head drive mechanism 32 is driven by mounting head drive unit 35, and thus mounting head 33 mounts the electronic component that is took out from tape feeder 31a of component supply unit 31, on substrate 4 that is held in substrate positioning section 30.

Camera 34 moves together with mounting head 33, and performs position recognition of substrate 4 on substrate positioning section 30 and position-recognizes a component taking out position of tape feeder 31a. Accordingly, suction position teaching that automatically teaches a position for component suction by suction nozzle 33a is possible. Mounting head drive unit 35, and bottom-of-substrate supporting section 30a are controlled by mounting controlling section 36, and thus a component mounting operation is performed on substrate 4. Mounting controlling section 36 is connected to network 2 through communicating section 37. In the above-described configuration, head drive mechanism 32 and mounting head 33 constitute component mounting mechanism 38 (refer to FIG. 4) for mounting the electronic component on substrate 4.

In reflow apparatus M8 that is illustrated in FIG. 3B, carrying path 41 along which substrate 4 is carried is horizontally provided within heating oven 42 that is provided on stage 40. The inside of heating oven 42 is partitioned into a plurality of heating zones 42a, and each heating zone 42a includes heating device 43 that is capable of temperature adjustment by temperature adjustment unit 44. Moreover, adjustment of an atmosphere condition, such as oxygen concentration or nitrogen concentration, for an internal atmosphere of heating zone 42a, is possible with atmosphere adjustment unit 45.

Temperature adjustment unit 44 and atmosphere adjustment unit 45 are controlled by reflow controlling section 46, and thus are capable of causing an atmosphere and a temperature that are set up within each heating zone 42a to be consistent with a reflow condition that is set in advance. Reflow controlling section 46 is connected to network 2 through communicating section 47, and is capable of causing a preparatory operation for causing the temperature or the atmosphere within each heating zone 42a to be consistent with a given condition to be performed according to a command from management apparatus 3 before starting the production.

The atmosphere within each heating zone 42a is adjusted by atmosphere adjustment unit 45. Moreover, in a state where heating device 43 is driven, and thus each heating zone 42a is heated to meet a given temperature condition, substrate 4 that has the electronic component mounted on the solder paste thereof, is caused to pass the heating zones sequentially from upstream side, and thus solder components in the solder paste are heated and melted. Accordingly, electronic component is solder-bonded to the substrate 4.

Figure 4:
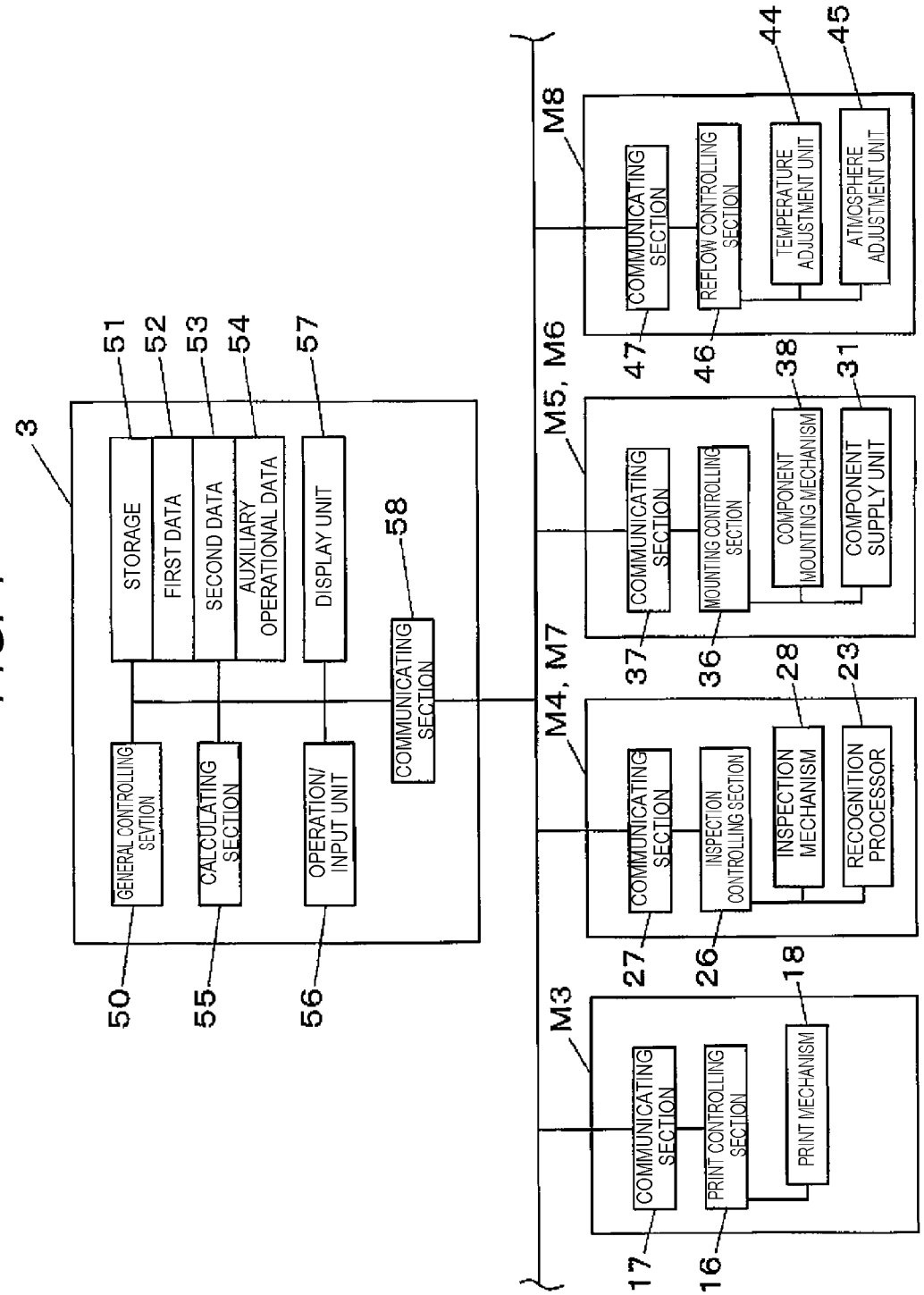
FIG. 4 is a block diagram illustrating a configuration of a control system of the mount substrate manufacturing system according to the exemplary embodiment of the present disclosure.

Next, a configuration of a control system of mounting substrate manufacturing system 1 is described referring to FIG. 4. In FIG. 4, management apparatus 3 includes general controlling section 50, storage 51, calculating section 55, operation/input unit 56, display unit 57, and communicating section 58. General controlling section 50 is a CPU that performs a function of processing by management apparatus 3, and controls each unit that will be described below, based on various programs or pieces of data that are stored in storage 51. Accordingly, operational management by each apparatus that constitutes mount substrate manufacturing line 1b is performed by management apparatus 3.

Stored in storage 51 are various pieces of data that include first data 52, second data 53, and auxiliary operational data 54. First data 52 is data relating to the period of time necessary for completing preparation for performing a process by the reflow apparatus. At this point, the period of time necessary for completing preparation for performing process is a period of time necessary for causing the temperature distribution in the plurality of heating zone 42a to be consistent with the temperature profile that is stipulated in advance according to a type of substrate 4 that is to be produced, for stabilization, and necessary for causing the oxygen concentration or the nitrogen concentration in the atmosphere within heating zone 42a to be consistent with the atmosphere condition that is stipulated in advance according to the type of substrate 4 that is to be produced, for stabilization. According to the present exemplary embodiment, two types of pieces of data, one for a preparation operation that is performed for start-up when new production starts, and the other for a machine switch operation that is performed when the type of substrate 4 that is to be produced is switched while the production is in progress are stipulated (refer to FIG. 5A).

Second data 53 is data relating to the period of time necessary for manufacturing a pre-reflow substrate in pre-reflow substrate manufacturing line 1a. For example, management apparatus 3 transmits a command to start production of the mount substrate to pre-reflow substrate manufacturing line 1a, and the period of time to complete an operation that is performed by each of substrate delivery apparatus M2 to inspection apparatus M7 on substrate 4 that is supplied from substrate supply apparatus M1 and thus to accomplish the pre-reflow substrate is stipulated for each type of substrate (refer to FIG. 5B). Furthermore, the period of time necessary for the operation by each of the apparatuses M1 to M7 may be stipulated for every type of substrate.

Auxiliary operational data 54 is not a production operation in each apparatus that itself constitutes mount substrate manufacturing line 1b, but means a process operation for performing normal production. The auxiliary operations according to the present exemplary embodiment include at least any one of an operation relating to a maintenance such as maintenance and inspection of the apparatus, an operation relating to calibration such as calibration of an operational parameter that is set in advance for correctly operating a process operation mechanism by each apparatus, and a warm-up operation that is to be performed before starting the production, which is necessary according to apparatus characteristics of each apparatus to stabilize each apparatus smoothly for operation.

Management apparatus 3 according to the present exemplary embodiment instructs at least one apparatus that constitutes pre-reflow substrate manufacturing line 1a to start production of the mount substrate, based on first data 52, or desirably based on both of first data 52 and second data 53. That is, management apparatus 3 instructs an upstream-side apparatus, rather than reflow apparatus M8 in mount substrate manufacturing line 1b, to start production of the mount substrate, based on first data 52, or desirably based on both of first data 52 and second data 53. Moreover, management apparatus 3 instructs at least one apparatus that constitutes pre-reflow substrate manufacturing line 1a to operate any one of the above-described auxiliary operations, based on first data 52 or desirably based on both of first data 52 and second data 53. That is, management apparatus 3 instructs the upstream-side apparatus, rather than reflow apparatus M8 in mount substrate manufacturing line 1 to operate any one of the above-described auxiliary operations, based on first data 52, or desirably based on both of first data 52 and second data 53.

First data 52 is referred to when the instruction of the time to start the production of the pre-reflow substrate and an instruction to perform the auxiliary operation are provided, and thus a timing loss can be reduced by providing a process instruction in which the period of time necessary to complete at least the preparation for the performing of the process by the reflow apparatus is considered. Moreover, the process instruction in which the period of time necessary to manufacture the pre-reflow substrate is also considered is possible by referring to second data 53, and it is possible to reduce the timing loss further.

Calculating section 55 has a function of calculating the waiting time to start production of the mount substrate, based on first data 52 and second data 53 that are described above. General controlling section 50 determines whether or not it possible to perform any one of the operation relating to the maintenance, the operation relating to the calibration, and the warm-up operation before the start of manufacturing an apparatus, within the waiting time that is calculated by calculating section 55 and the operation time that is stipulated in auxiliary data 54, that is, within the waiting time to start production of the mount substrate. In a case where it is determined that an auxiliary process that is possible to perform within the waiting time is present, general controlling section 50 of management apparatus 3 instructs the corresponding apparatus to perform the auxiliary process that is possible to perform. At this time, in a case where multiple auxiliary processes are present, the corresponding apparatus is instructed to perform the auxiliary process according to priority levels that are stipulated in advance.

Operation/input unit 56 is an input device such as a touch panel or a keyboard, and performs an input operation such as input of an operation command or data into management apparatus 3. Display unit 57 is a display device such as a liquid panel, and performs display of a guide screen at the time of the input operation by operation/input unit 56 or of various report screens. Communicating section 58 is a communication interface. Communicating section 58 is connected to each apparatus that constitutes mount substrate manufacturing line 1b, through network 2 and transmits and receives a control signal or data.

Print controlling section 16 of print apparatus M3 is connected to network 2 through communicating section 17. Print controlling section 16 controls print mechanism 18. Inspection controlling sections 26 of inspection apparatuses M4 and M7 are connected to network 2 through communicating section 17. Inspection controlling sections 26 control inspection mechanism 28 and recognition processor 23. Mounting controlling sections 36 of component mounting apparatuses M5 and M6 are connected to network 2 through communicating section 37. Mounting controlling sections 36 control component mounting mechanism 38 and component supply unit 31. Reflow controlling section 46 of reflow apparatus M8 is connected to network 2 through communicating section 47. Reflow controlling section 46 controls temperature adjustment unit 44 and atmosphere adjustment unit 45. The controlling section of each apparatus is connected to management apparatus 3 through network 2, and thus management apparatus 3 is capable of controlling starting/ending of a process by each apparatus.

Next, first data 52, second data 53, and auxiliary operational data 54 that are stored in storage 51 are described referring to FIGS. 5A to 6. First, configurations of first data 52 and second data 53 are described referring to FIGS. 5A and 5B. First data 52 that is illustrated in FIG. 5A indicates the period of time necessary to complete the preparation for performing the process by reflow apparatus M8. First data 52 is configured from start-up data 52(1) that is necessary for start-up of the apparatus when new production starts in mount substrate manufacturing line 1b and machine-switching data 52(2) that is necessary when a type of substrate that is to be produced is switched while the production is in progress.

Pieces of start-up data 52(1) result from organizing as pieces of data "the period of time required for preparation" 52(1)b (aa, bb, cc, and so forth)" that are necessary for types of substrates (at this point, A, B, C and so forth), respectively, that are indicated in "type of substrate" 52(1)a, based on numerical values of actual results, or by making predictions or the like. That is, with regard to the reflow condition (a heating profile and the atmosphere condition) in reflow apparatus M8, because an optimal condition differs depending on the type of substrate 4, the period of time for reaching the optimal condition also differs depending on the type of substrate 4.

Furthermore, pieces of machine-switching data 52(2) result from organizing as pieces of data "the period of time required for preparation" 52(2)b (ab, ab, ba, and so forth) that are necessary for switch patterns, that is, "switch patterns" 52(2)a (switching from the type A of substrate to the type B of substrate is expressed as (A→B), and switching between the types of substrates are, hereinafter in the same manner, expressed as (A→C), (B→A), (B→C), and so forth), respectively, according to which the type of substrate is switched, based on numerical values of results, or making predictions or the like.

Second data 53 that is illustrated in FIG. 5B is data relating to the period of time necessary to manufacture the pre-reflow substrate by each apparatus that constitutes pre-reflow substrate manufacturing line 1a. In the same manner as pieces of start-up data 52(1), pieces of second data 53 also result from organizing as pieces of data "the period of time required for manufacturing" 53b (a*a, b*b, c*c, and so forth) that are necessary for the types of substrates 4, that is, "types of substrates" 53a (A, B, C, and so forth), respectively, based on numerical values of results, or making simulations or the like.

Next, auxiliary operational data 54 is described referring to FIG. 6. At this point, the auxiliary operation is not a process operation relating directly to the production operation by each apparatus in mount substrate manufacturing line 1b, but means a process for enabling the process operation by each apparatus to be performed normally and smoothly. At this point, as operational types 60 of the auxiliary operations, three types, that is, "maintenance" 65, "calibration" 66, and "warm-up" 67 are illustrated, in a major item 61. "The period of time required for operation" 63 and "priority level" 64 are stipulated, as details of data, in each minor item 62 that results from dividing major item 61 for more detail.

For example, for "maintenance" 65, "suction nozzle" 65a is illustrated as minor item 62. That is, suction nozzle 33a that is mounted on mounting head 33 in print apparatus M3 that is illustrated in FIG. 3A needs a maintenance process operation, such as a cleaning operation of removing contaminants that are attached to a lower end portion of the nozzle at suitably-set intervals. As "the period of time required for operation" 63 for performing the maintenance process operation, X minutes/ one nozzle is stipulated, and "priority level" 64 is stipulated that indicates an order of performing priority in a case where an item for a process operation that needs to be additionally performed is present. For "Priority level" 64, in an example that is illustrated here, A (high priority level), B (middle priority level), and C (low priority level) are assigned in order of decreasing the priority level. That is, an operation relating to the maintenance in auxiliary operational data 54 according to the present exemplary embodiment is maintenance of suction nozzles 33a of component mounting apparatuses M5 and M6.

Furthermore, for "calibration" 66, "mounting head" 66a, "tape feeder" 66b, and "beam heat compensation" 66c are illustrated as minor item 62. "Mounting head" 66a is an item that is necessary in a case where mounting head 33 is replaced with a different type of mounting head 33 in component mounting apparatuses M5 and M6 that are illustrated in FIG. 3A, for example, calibration of a position of a suction hole in a lower end portion of nozzle 33a or the like. In this example, the actual position of the suction hole in suction nozzle 33a is detected as a result of a component recognition camera below suction nozzle 33a capturing an image of suction nozzle 33a, an amount of positional deviation from a normal position is obtained, and the obtained amount of positional deviation is set to be a offset value. For "the period of time required for operation" 63, Y minutes/one head is stipulated, and "priority level" 64 is "A" ranking.

"Tape feeder" 66b is subject to calibration of which a detailed function is teaching of the position for the component suction, which is performed at a given timing, such as when tape feeder 31a is replaced in component supply units 31 of component mounting apparatuses M5 and M6. That is, the position for the component suction to which suction nozzle 33a has to be position-aligned at the time of the component suction operation is determined by moving camera 34 above tape feeder 31a and then capturing an image of the component taking out position. As "the period of time required for operation" 63, Z minutes/one feeder is stipulated, and priority level 64 is "B" ranking.

"Beam heat compensation" 66c is calibration of which a detailed function is to offset for a positional error due to thermal deformation over time, which results from a temperature of a beam constituting head drive mechanism 32 increasing with the passage of the operation time. That is, when the thermal deformation over time occurs, the positional error between a target position that is designated by a control command from mounting controlling section 36 and an actual position that is reached by mounting head 33 and camera 34. In the calibration of which an object is "beam heat compensation" 66c, an amount of deviation equivalent to a thermal error is obtained based on a result of recognizing a position by camera 34 capturing an image of a fixed reference point that is provided in the stage or the like, and a value of the control command is corrected according to the amount of deviation. As "the period of time required for operation" 63, M minutes/one time is stipulated, and priority level 64 is "A" ranking.

Furthermore, as "warm-up" 67, "idling" 67a of component mounting apparatuses M5 and M6 is illustrated as minor item 62. In "idling" 67a, idling that does not accompany an actual process operation is performed for a given period of time that is determined in advance in order to facilitate the operation of each mechanism before operating component mounting apparatuses M5 and M6. As "the period of time required for operation" 63, N minutes (the minimum time necessary) is stipulated, and "priority level" 64 is "C" ranking. Numerical values of X, Y, Z, M and N that stipulate "the period of time required for operation" 63 described above are suitably set based on an empirical value. Furthermore, items that are illustrated in FIG. 6 are examples, and if the process operation in each apparatus is normally performed and this is an effective process, process items other than these may be included in the auxiliary operation.

Next, the mount substrate manufacturing method that is performed in mount substrate manufacturing system 1 which is configured to include above-described mount substrate manufacturing line 1b and management apparatus 3 that is connected to mount substrate manufacturing line 1b through network 2 is described referring to FIGS. 7 to 10. FIG. 10 illustrates, in time sequence, before-starting-production processes that are performed before the production of the mount substrate starts in mount substrate manufacturing line 1b, and illustrates a relationship to the auxiliary process and the like that are performed concurrently with a reflow preparation process of causing reflow apparatus M8 to be in a before-starting-production state. In an example that is described here, the reflow preparation process starts at timing t1 (reflow preparation starting timing), and ends at timing t2 (reflow preparation completion timing).

Figure 7:
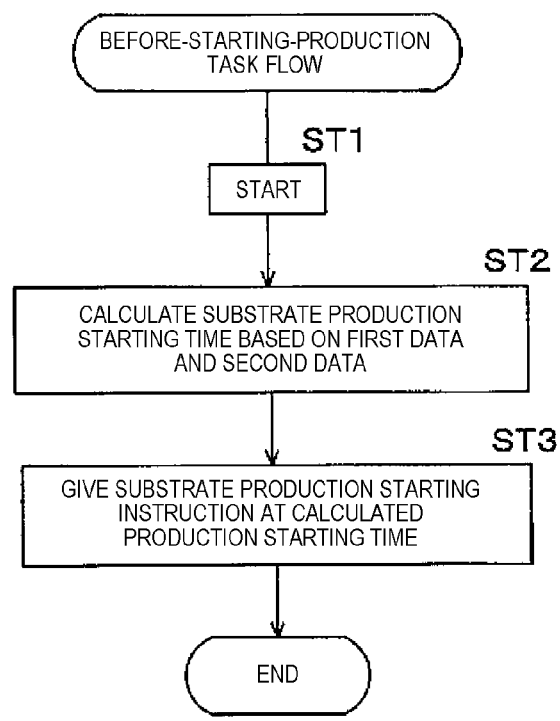
FIG. 7 is a flowchart of a before-starting-production process in the mount substrate manufacturing method according to the exemplary embodiment of the present disclosure.

First, a before-starting-production process flow in a case where the auxiliary process is not performed concurrently with the reflow preparation process is described referring to FIGS. 7 and 10. First, when the before-starting-production process starts (ST 1), a substrate production starting time is calculated based on first data 52 and second data 53 that are calculated by calculating section 55 (ST 2). At this point, first, required time T1 (refer to "the period of time required for preparation" 52(1)b) that is illustrated in FIG. 5A) for the reflow preparation process that corresponds to substrate 4 that is to be produced and required time T3 (refer to "the period of time required for manufacturing" 53b that is illustrated in FIG. 5B) for manufacturing the substrate are read. Subsequently, calculating section 55 calculates timing t2 that is elapsed required time T1 from timing t1 that is illustrated in FIG. 10. Subsequently, calculating section 55 calculates timing t4 that is earlier manufacturing required time T3 than timing t2, as a production starting time (a pre-reflow substrate production starting timing).

Subsequently, at the calculated production starting time (timing t4), at least one apparatus that constitutes pre-reflow substrate manufacturing line 1a is instructed to start the production (ST 3). This production starting instruction is performed by a control function that general controlling section 50 of management apparatus 3 has, and with the production starting instruction, the before-starting-production process ends. That is, management apparatus 3 instructs at least one apparatus that constitutes pre-reflow substrate manufacturing line 1a to start production of the mount substrate, based on first data 52 with the above-described configuration, or desirably based on first data 52 and second data 53. That is, at least one of the apparatuses that is at a more upstream side than reflow apparatus M8 in mount substrate manufacturing line 1b is instructed to start production of the mount substrate. At this time, management apparatus 3 is made to instruct at least one apparatus that constitutes pre-reflow substrate manufacturing line 1a to start production of the mount substrate, in such a manner the pre-reflow substrate is manufactured in accordance with timing t2 (reflow preparation completion timing) at which the preparation for the performing of the process by reflow apparatus M8 is completed.

Figure 8:
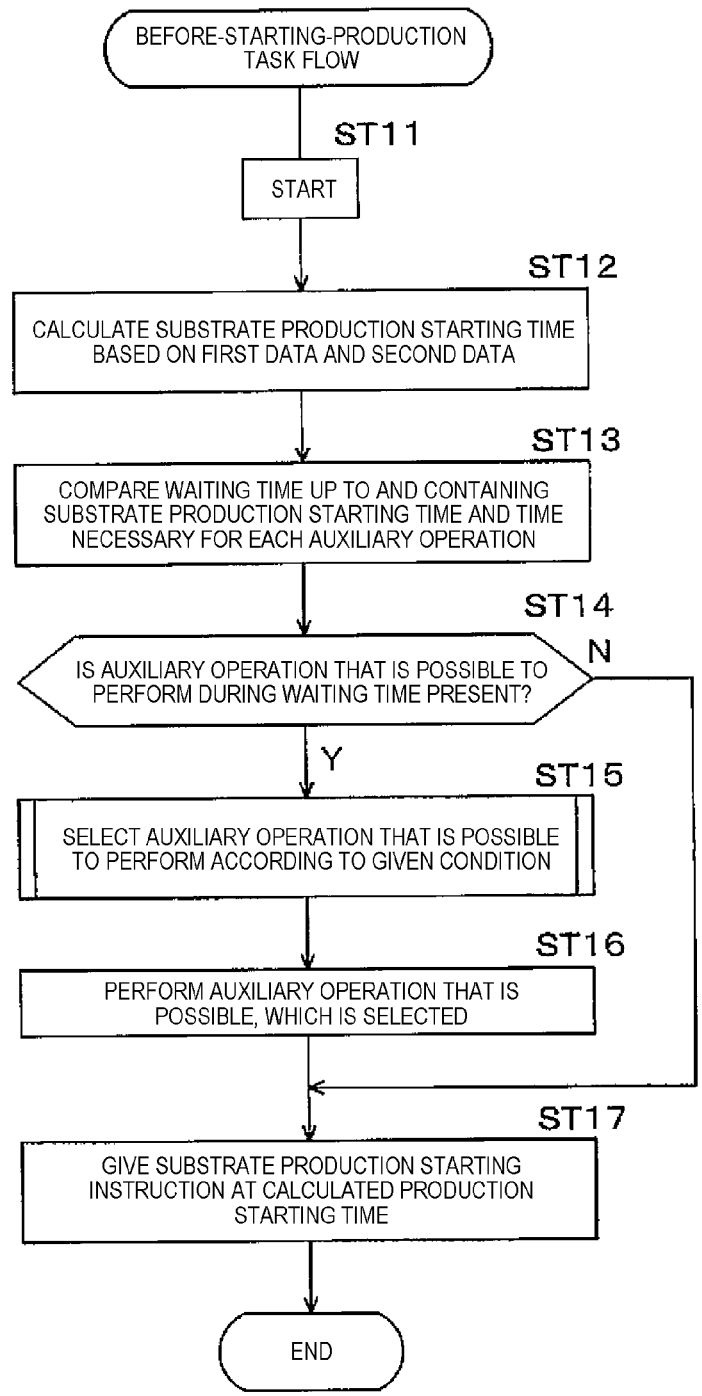
FIG. 8 is a flowchart of a before-starting-production process in the mount substrate manufacturing method according to the exemplary embodiment of the present disclosure.

Next, the before-starting-production process flow in a case where the auxiliary process is performed is described referring to FIGS. 8 and 10. First, when the before-starting-production process starts to be performed (ST 11), the substrate production starting time is calculated by calculating section 55 based on first data 52 and second data 53 (ST 12), in the same manner as in the example that is illustrated in FIG. 7. Subsequently, the waiting time up to and including the substrate production starting time and the period of time necessary for each auxiliary operation are compared with each other (ST 13). At this point, the waiting time differs depending on whether or not the reflow preparation process (refer to machine-switching data 52(2) that is illustrated in FIG. 5A) that is to be performed is accompanied by a preparation process for machine switching that accompanies substrate-type switching. FIG. 10 illustrates an example in which the preparation process is necessary at required time T2. In a case where the reflow preparation process (refer to machine-switching data 52(2)) is not accompanied by the preparation, required time T2 is 0.

As illustrated in FIG. 10, the waiting time (first waiting time TW1) up to and including the substrate production starting time is obtained using the equation (T1−T2−T3), and first waiting time TW1 and "the period of time required for operation" 63 in auxiliary operation data 54 that is illustrated in FIG. 6 are compared with each other. It is determined whether or not the auxiliary operation is possible to perform during first waiting time TW1 is present (ST14). At this point, in a case where it is determined that the auxiliary operation that is possible to perform is present, the auxiliary operation that is possible to perform is selected in accordance with a predetermined condition (ST 15). In a case where it is determined that the auxiliary operation that is possible to perform is not present, proceeding to ST 17 takes place. In the same manner as in FIG. 7 (ST 3), at the calculated production starting time (timing t4), at least one of the apparatuses that constitute pre-reflow substrate manufacturing line 1a is instructed to start the production.

That is, in an example that is illustrated in FIG. 8, in the same manner, management apparatus 3 instructs at least one apparatus that constitutes pre-reflow substrate manufacturing line 1a to start production of the mount substrate, in such a manner that the pre-reflow substrate is manufactured in accordance with timing t2 (reflow preparation completion timing) at which the preparation for the performing of the process by reflow apparatus M8 is completed. That is, at least one of the apparatuses that is at a more upstream side than reflow apparatus M8 in mount substrate manufacturing line 1b is instructed to start production of the mount substrate.

Figure 9:
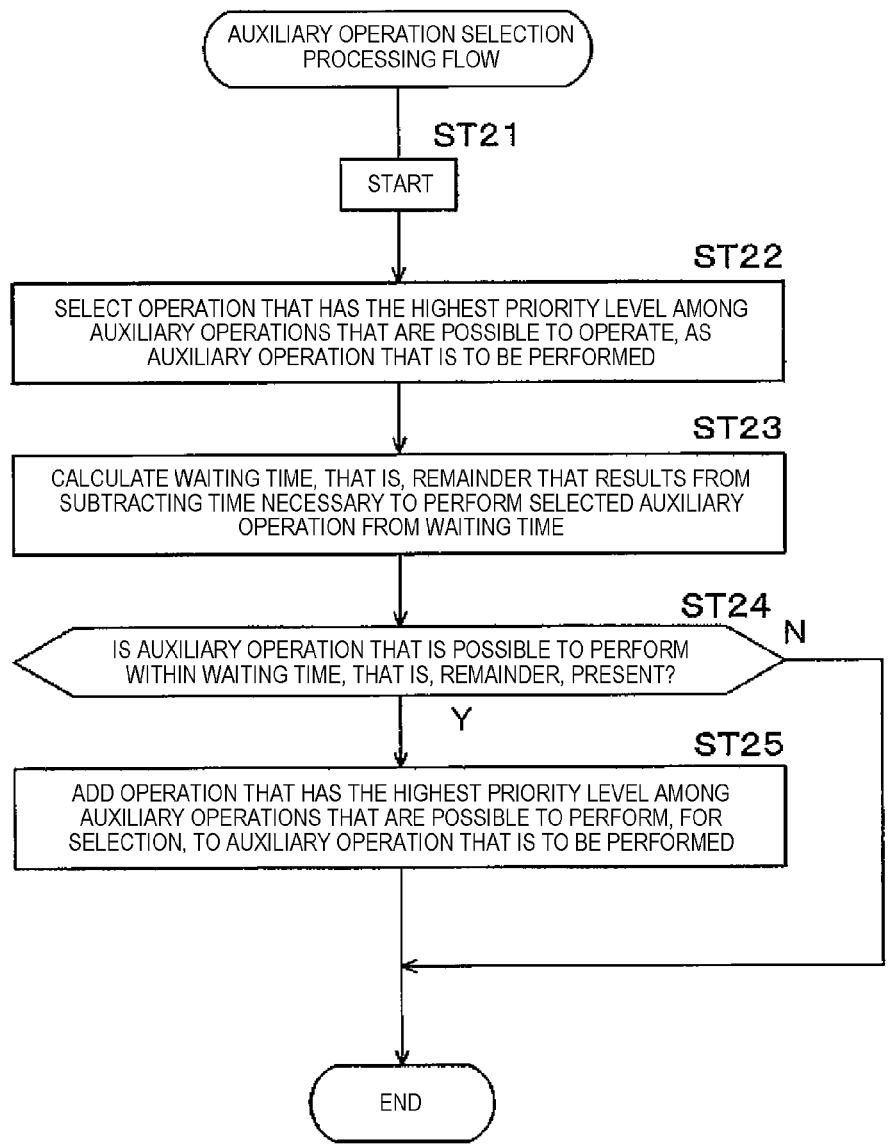
FIG. 9 is a flowchart of a before-starting-production process in the mount substrate manufacturing method according to the exemplary embodiment of the present disclosure.

A flow of auxiliary operation selection processing that is performed at this point (ST 15) is described referring to FIG. 9. First, when the selection processing starts (ST 21), an operation (first auxiliary operation) that has the highest priority level among the auxiliary operations that are possible to perform is selected as an auxiliary operation that is to be performed (ST 22). Next, the waiting time (second waiting time TW2 (=TW1−T4)), that is, the remainder that results from subtracting the period of time necessary (required time T4) for performing the selected auxiliary operation from the waiting time (first waiting time TW1), is calculated (ST 23). It is determined whether or not the auxiliary operation that is possible to perform within the waiting time (second waiting time TW2), that is, the remainder, is present (ST 24). For example, it is determined whether or not at least any one of the operation relating to the maintenance, the operation relating to the calibration, and the warm-up operation that is to be performed before the apparatus starts the production is possible to perform within the waiting time. At this point, in a case where the auxiliary operation that is possible to perform is not present, the processing ends and returning to FIG. 8 takes place.

In contrast, in a case where it is determined in (ST 24) that the auxiliary operation that is possible to perform is present, an auxiliary operation (a second auxiliary operation) that has the highest priority level among the auxiliary operations that are possible to perform within the remainder is added, for selection, to the auxiliary operation that is to be performed (ST 25), and then the processing ends and returning to FIG. 8 takes place. If the returning to FIG. 8 takes place, the auxiliary operation that is possible to perform, which is selected, is performed (ST 16). That is, the first auxiliary operation starts at timing t3, and the second auxiliary operation starts at timing t5 at which required time T4 necessary for performing the first auxiliary operation elapses and the first auxiliary operation is completed. The second auxiliary operation is completed at timing t6 at which required time T5 necessary for performing the first auxiliary operation elapses. In a case where there is sufficient waiting time during a period of time from timing t6 to timing t4, other auxiliary operations that are possible to perform are selected and are sequentially performed. Thereafter, at timing t4 that is the production starting time, at least one of the apparatuses that constitute pre-reflow substrate manufacturing line 1a is instructed to start the production (ST 17) and the before-starting-production process flow ends.

As described above, in the management apparatus, the mount substrate manufacturing system, and the mount substrate manufacturing method according to the present exemplary embodiment, mount substrate manufacturing line 1b that includes at least print apparatus M3, component mounting apparatuses M5 and M6, and reflow apparatus M8 is connected to management apparatus 3 through network 2. In this configuration, at least one of the apparatuses that is at a more upstream side than reflow apparatus M8 is instructed to start production of the mount substrate, based on first data 52 relating to the period of time necessary for management apparatus 3 to complete the preparation for the performing of the process by reflow apparatus M8, or desirably based on first data 52 and second data 53. Accordingly, a decrease in production efficiency that is due to the fact that other apparatuses wait without starting the production during a period of time up to and including the time when the preparation process is completed in reflow apparatus M8 can be suppressed.

Furthermore, at least one of the apparatuses that is at a more upstream side than reflow apparatus M8 is instructed to perform at least any one of the operation relating to the maintenance, the operation relating to the calibration, and the warm-up operation that is to be performed before starting production of the mount substrate, based on first data 52 relating to the period of time necessary for management apparatus 3 to complete the preparation for the performing of the process by reflow apparatus M8, or desirably based on first data 52 and second data 53. Accordingly, a waste of time, which is due to the fact that other apparatuses wait without starting the production during a period of time up to and including the time when the preparation process is completed in a reflow apparatus, can be suppressed from occurring. In this case, the at least one apparatus instructed to start production of the mount substrate may be the same as at least one apparatus instructed to perform any one of an operation relating to maintenance, an operation relating to calibration, and a warm-up operation that is to be performed before starting production of the mount substrate. Alternatively, they may be different from each other.

As described above, the management apparatus, the mount substrate manufacturing system, and the mounting substrate manufacturing method according to the present disclosure have an effect in which a decreased in production efficiency that is due to the fact that other apparatuses wait without starting the production during a period of time up to and including the time when the preparation process is completed in a reflow apparatus can be suppressed, and are useful in a field in which a mount substrate is manufactured in a mount substrate manufacturing line that includes a reflow apparatus.

What is claimed is:

1. A management apparatus that is connected to a mount substrate manufacturing line which includes at least a print apparatus, a component mounting apparatus, and a reflow apparatus, through a network,
wherein the management apparatus instructs at least one of the print apparatus and the component mounting apparatus which is positioned at a more upstream side than the reflow apparatus in the mount substrate manufacturing line, to start production of a mount substrate, based on first data,
wherein the first data includes a time required for the reflow apparatus to complete a preparation process,
wherein the preparation process is at least one of a start-up process and a machine-switching process that causes the reflow apparatus to be in a state of being operable at the time of starting production, and
wherein at least one of the print apparatus and the component mounting apparatus positioned upstream of the reflow apparatus is instructed to start production of the mount substrate without waiting for the reflow apparatus to complete the preparation process.

2. The management apparatus of claim 1 comprising:
a storage which stores the first data.

3. The management apparatus of claim 1,
wherein the management apparatus instructs at least one of the print apparatus and the component mounting apparatus which is positioned at the more upstream side than the reflow apparatus in the mount substrate manufacturing line, to start production of the mount substrate, based on the first data and second data relating to a time necessary for manufacturing a pre-reflow substrate in the mount substrate manufacturing line.

4. The management apparatus of claim 3 comprising:
a storage which stores the first data and the second data.

5. The management apparatus of claim 3,
wherein the management apparatus instructs at least one of the print apparatus and the component mounting apparatus which is positioned at the more upstream side than the reflow apparatus in the mount substrate manufacturing line, to start production of the mount substrate, in such a manner that the pre-reflow substrate is manufactured in accordance with a timing at which the preparation process for the reflow apparatus is completed.

6. The management apparatus of claim 1,
wherein the management apparatus instructs at least one of the print apparatus and the component mounting apparatus which is positioned at the more upstream side than the reflow apparatus in the mount substrate manufacturing line and includes at least one of the print apparatus and the component mounting apparatus instructed to start production of the mount substrate, to perform any one of an operation relating to maintenance, an operation relating to calibration, and a warm-up operation that is to be performed before starting production of the mount substrate, based on the first data.

7. The management apparatus of claim 1,
wherein the time required to complete the preparation process by the reflow apparatus is the time necessary for causing a temperature distribution in a heating zone of the reflow apparatus to be consistent with a temperature profile that is stipulated in advance according to a type of substrate that is to be produced.

8. A mount substrate manufacturing system comprising:
a mount substrate manufacturing line including at least a print apparatus, a component mounting apparatus, and a reflow apparatus; and
a management apparatus connected to the mount substrate manufacturing line through a network,
wherein the management apparatus instructs at least one of the print apparatus and the component mounting apparatus which is positioned at a more upstream side than the reflow apparatus in the mount substrate manufacturing line to start production of a mount substrate, based on first data,
wherein the first data includes a time required for the reflow apparatus to complete a preparation process,
wherein the preparation process is at least one of a start-up process and a machine-switching process that causes the reflow apparatus to be in a state of being operable at the time of starting production, and
wherein at least one of the print apparatus and the component mounting apparatus positioned upstream of the reflow apparatus is instructed to start production of the mount substrate without waiting for the reflow apparatus to complete the preparation process.

9. The mount substrate manufacturing system of claim 8, wherein the management apparatus includes a storage which stores the first data.

10. The mount substrate manufacturing system of claim 8, wherein the management apparatus instructs at least one of the print apparatus and the component mounting apparatus which is positioned at the more upstream side than the reflow apparatus in the mount substrate manufacturing line to start production of the mount substrate, based on the first data and second data relating to a time necessary for manufacturing a pre-reflow substrate in the mount substrate manufacturing line.

11. The mount substrate manufacturing system of claim 10, wherein the management apparatus includes a storage which stores the first data and the second data.

12. The mount substrate manufacturing system of claim 10, wherein the management apparatus instructs at least one of the print apparatus and the component mounting apparatus which is positioned at the more upstream side than the reflow apparatus in the mount substrate manufacturing line, to start production of the mount substrate, in such a manner that the pre-reflow substrate is manufactured in accordance with a timing at which the preparation process by the reflow apparatus is completed.

13. The mount substrate manufacturing system of claim 8, wherein the management apparatus instructs at least one of the print apparatus and the component mounting apparatus which is positioned at the more upstream side than the reflow apparatus in the mount substrate manufacturing line and includes at least one of the print apparatus and the component mounting apparatus instructed to start production of the mount substrate, to perform any one of an operation relating to maintenance, an operation relating to calibration, and a warm-up operation that is to be performed before starting production of the mount substrate, based on the first data.

14. A mount substrate manufacturing method for use in a mount substrate manufacturing system that includes a mount substrate manufacturing line including at least a print apparatus, a component mounting apparatus, and a reflow apparatus, and a management apparatus connected to the mount substrate manufacturing line through a network, the method comprising:
   determining a time necessary for the reflow device to complete a preparation process, wherein the preparation process causes the reflow device to be in a before-starting-production state; and
   instructing at least one of the print apparatus and the component mounting apparatus which is positioned at a more upstream side than the reflow apparatus in the mount substrate manufacturing line, to start production of a mount substrate, based on the time necessary for the reflow device to complete the preparation process and without waiting for the reflow device to complete the preparation process.

15. The mount substrate manufacturing method of claim 14, wherein the management apparatus instructs at least one of the print apparatus and the component mounting apparatus which is positioned at the more upstream side than the reflow apparatus in the mount substrate manufacturing line, to start production of the mount substrate, based additionally on a time necessary for manufacturing a pre-reflow substrate in the mount substrate manufacturing line.

16. The mount substrate manufacturing method of claim 15, wherein the management apparatus instructs at least one of the print apparatus and the component mounting apparatus which is positioned at the more upstream side than the reflow apparatus in the mount substrate manufacturing line, to start production the mount substrate, in such a manner that the pre-reflow substrate is manufactured in accordance with a timing at which the preparation process by the reflow apparatus is completed.

17. The mount substrate manufacturing method of claim 14, wherein the management apparatus instructs at least one of the print apparatus and the component mounting apparatus which is positioned at the more upstream side than the reflow apparatus in the mount substrate manufacturing line and includes at least one of the print apparatus and the component mounting apparatus instructed to start production of the mount substrate, to perform any one of an operation relating to maintenance, an operation relating to calibration, and a warm-up operation that is to be performed before starting production of the mount substrate, based on the time necessary for the reflow device to complete the preparation process.

18. The mount substrate manufacturing method of claim 14, wherein the time necessary to complete the preparation process by the reflow apparatus is the time necessary for causing a temperature distribution in a heating zone of the reflow apparatus to be consistent with a temperature profile that is stipulated in advance according to a type of substrate that is to be produced.

* * * * *